United States Patent
Lee

(10) Patent No.: US 7,782,282 B2
(45) Date of Patent: Aug. 24, 2010

(54) DISPLAY DEVICE AND DRIVING METHOD THEREOF

(75) Inventor: Ju-Young Lee, Gyeongsangbukdo (KR)

(73) Assignee: LG Display Co., Ltd., Seoul (KR)

(*) Notice: Subject to any disclaimer, the term of this patent is extended or adjusted under 35 U.S.C. 154(b) by 1415 days.

(21) Appl. No.: 11/152,094

(22) Filed: Jun. 15, 2005

(65) Prior Publication Data
US 2006/0022920 A1 Feb. 2, 2006

(30) Foreign Application Priority Data
Jul. 28, 2004 (KR) .................. 10-2004-0059043

(51) Int. Cl.
G09G 3/36 (2006.01)
G09G 5/00 (2006.01)
G06F 3/038 (2006.01)

(52) U.S. Cl. .................. 345/87; 345/98; 345/99; 345/100; 345/204

(58) Field of Classification Search .......... 345/204, 345/87, 98–100
See application file for complete search history.

(56) References Cited

U.S. PATENT DOCUMENTS

| | | | |
|---|---|---|---|
| 5,410,583 A | 4/1995 | Weisbrod et al. | |
| 5,870,071 A | 2/1999 | Kawahata | 345/100 |
| 6,292,163 B1 | 9/2001 | Nam et al. | |
| 6,300,928 B1* | 10/2001 | Kim | 345/92 |
| 6,690,347 B2* | 2/2004 | Jeon et al. | 345/100 |
| 7,023,410 B2* | 4/2006 | Lee et al. | 345/87 |
| 7,106,292 B2* | 9/2006 | Moon | 345/100 |
| 7,369,111 B2* | 5/2008 | Jeon et al. | 345/100 |
| 7,436,923 B2* | 10/2008 | Tobita | 377/64 |
| 2003/0002615 A1 | 1/2003 | Morosawa et al. | 377/64 |
| 2003/0043104 A1 | 3/2003 | Lee et al. | 345/92 |
| 2003/0085885 A1* | 5/2003 | Nakayoshi et al. | 345/205 |

(Continued)

FOREIGN PATENT DOCUMENTS

DE 19828384 1/1999

(Continued)

OTHER PUBLICATIONS

Brian W. Faughnan et al., "Polycrystalline-Silicon LCDs With High-Speed Integrated Scanners," 1988, Proceedings of the SID, vol. 29/4, pp. 279-282.

*Primary Examiner*—Alexander S. Beck
(74) *Attorney, Agent, or Firm*—Morgan Lewis & Bockius LLP

(57) ABSTRACT

A display device includes first and second substrates facing each other, the first substrate having a display region and a non-display region, at least one data line on the first substrate, at least one gate line crossing the data line, the gate line supplied with a gate voltage, at least one pixel in the display region connected to a corresponding gate line and data line, and a first driving circuit including at least a first driving unit connected to a first gate line to output a first gate voltage, and a second driving unit connected to a second gate line to output a second gate voltage, wherein the first driving unit is supplied with at least a start gate voltage and the second gate voltage from the second driving unit to output the first gate voltage to the pixel.

24 Claims, 15 Drawing Sheets

U.S. PATENT DOCUMENTS

| | | | |
|---|---|---|---|
| 2003/0189542 A1 | 10/2003 | Lee et al. | 345/93 |
| 2003/0227433 A1 | 12/2003 | Moom | 345/100 |
| 2004/0028172 A1 | 2/2004 | Yu | 377/64 |
| 2004/0189585 A1* | 9/2004 | Moon | 345/100 |

FOREIGN PATENT DOCUMENTS

| | | |
|---|---|---|
| EP | 1 231 594 A1 | 8/2002 |
| EP | 1 431 953 A2 | 6/2004 |

* cited by examiner

DISPLAY DEVICE AND DRIVING METHOD THEREOF

The present invention claims benefit of Korean Patent Application No. P2004-0059043, filed in Korea on Jul. 28, 2004, which is hereby incorporated by reference.

BACKGROUND OF THE INVENTION

1. Field of the Invention

The present invention relates to a display device and a method of driving a display device, and more particularly, to a liquid crystal display (LCD) device and a method of driving an LCD device.

2. Background of the Related Art

In general, an LCD device includes two substrates that are spaced apart and face each other, and a liquid crystal material layer interposed between the two substrates. Each of the substrates includes electrodes that face each other, wherein a voltage supplied to each of the electrodes induces an electric field to the liquid crystal material layer. Accordingly, alignment of liquid crystal molecules of the liquid crystal material layer is changed by varying an intensity or direction of the induced electric field, thereby changing light transmissivity through the liquid crystal material layer. Thus, the LCD device displays images by varying the induced electric field.

FIG. 1 is a block diagram of an LCD device according to the related art, and FIG. 2 is a schematic view of a liquid crystal panel of FIG. 1.

As shown in FIG. 1, an LCD device includes an interface 10, a timing controller 12, a voltage generating portion 14, a gamma reference voltage portion 16, data and gate driving portions 18 and 20 respectively, and a liquid crystal panel 2.

The interface 10 is supplied with, among other things, data signals and synchronizing signals from a driving system, for example, a computer system. The interface 10 supplies those signals to the timing controller 12. Interface 10 may be a low voltage differential signal (LVDS) interface, a transistor-transistor logic (TTL) interface or other similar devices.

The liquid crystal panel 2 includes, as shown in FIG. 2, a plurality of gate lines GL1 to GLn and a plurality of data lines DL1 to DLm. The gate and data lines GL and DL, respectively, are each connected to a pixel P, which includes a pixel transistor T and a liquid crystal capacitor $C_L$.

The timing controller 12 generates and supplies control signals to the data and gate driving portions 18 and 20, respectively, and the timing controller 12 supplies data signals to the data driving portion 18.

The gamma reference voltage portion 16 supplies a gamma reference voltage to a digital-to-analog converter (DAC) (not shown) of the data driving portion 18.

The data driving portion 18 generates a data voltage corresponding to the data signal using the gamma reference, and supplies the generated data voltage to the data line DL. The gate driving portion 20 supplies gate voltages having on- or off-levels to the gate lines GL1 to GLn. Each of the gate lines GL1 to GLn is sequentially selected during a horizontal period. The selected gate line GL is supplied with the "ON" gate voltage and the non-selected gate line GL is supplied with the "OFF" gate voltage. When the gate line GL is selected with the "ON" gate voltage, the pixel transistor T connected to the selected gate line GL is turned on, and the data voltage is supplied to the liquid crystal capacitor CL.

The voltage generating portion 14 generates and supplies the voltages driving each of the components of the LCD device as shown in FIG. 1.

In the above explained LCD device, gate and data driving portions 18 and 20, respectively, have a plurality of drivers using integrated chips (ICs). The data and gate driver ICs are bonded to the liquid crystal panel 2 through gate and data pads (not shown) thereon using tape carrier packing (TCP) method or chip on film (COF) method.

FIG. 3 is a view of a gate driver of an LCD device according to the related art.

As shown in FIG. 3, a gate driver 20 using an integrated chip (IC) is supplied with driving voltages and control signals. Driving voltages include, among other things, high gate voltage VGH, a low gate voltage VGL, a positive supply voltage VCC, and a negative supply voltage VEE. Control signals include, among other things, a gate start pulse GSP, a gate shift clock GSC, and a gate output enable GOE.

The high and low gate voltages VGH and VGL are on and off gate voltages, respectively. The positive and negative supply voltages VCC and VEE, respectively, are source voltages driving the gate driver 20.

The gate start pulse GSP is a signal notifying a start gate line, for example, a first gate line GL1. The gate shift clock GSC is a signal notifying a turn-on time of a pixel transistor T. The gate output enable GOE is a signal controlling a voltage output of the gate driver 20.

Gate driver 20 using the gate driving voltages and the gate control signals are arranged in one side of the LCD panel 2 (in FIG. 1). Accordingly, the gate driving voltages and the gate control signals are transferred through the gate driver and lines linking adjacent data drivers.

As explained above, the related art LCD device uses a gate driver using integrated chips (ICs). Accordingly, separate ICs for the gate driver and separate processes for bonding the gate driver to the liquid crystal panel are required, thus rendering production processes more complex and increasing production costs. Furthermore, a larger space for the gate and data pads is needed to bond the ICs to the liquid crystal panel.

Furthermore, the plurality of driving voltages and control signals used to drive a plurality of gate driver ICs require long wires for transferring the driving voltages and the control signals. Accordingly, power consumption increases, and driving circuit reliability is reduced.

SUMMARY OF THE INVENTION

Accordingly, the present invention is directed to a display device and method of driving a display device that substantially obviate one or more of problems due to limitations and disadvantages of the related art.

An object of the present invention is to provide a display device that can simplify production processes and reduce production costs, power consumption, space for gate and data pads, and increase circuit reliability.

Another object of the present invention is to provide a method of driving a display device that can simplify production processes and reduce production costs, power consumption, space for gate and data pads, and increase circuit reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a display device includes first and second substrates facing each other, the first substrate having a display region and a non-display region, at least one data line on the first substrate, at least one gate line crossing the data line, the gate line supplied with a gate voltage, at least one pixel in the display region connected to a corresponding gate line and data line, and a first driving circuit including at least a first driving unit connected to a first gate line to output a first gate voltage, and a second driving unit connected to a second gate line to output a second gate voltage, wherein the first driving unit is supplied with at least a start gate voltage and the second gate voltage from the second driving unit to output the first gate voltage to the pixel.

In another aspect, a method of driving a display device includes outputting first and second gate voltages to first and second gate lines, respectively; outputting first and second voltages using the first and second gate voltages, the first voltage being one of on and off gate voltages, and the second voltage being the other of the on and off gate voltages; outputting a third gate voltage to a third gate line using the first and second voltages, and a first control signal, the third gate voltage being one of the on and off gate voltages; and outputting a data voltage to a data line and storing the data voltage in a pixel connected to the third gate line and the data line, wherein the first, second and third gate voltages have the on gate voltages in first, second and third horizontal periods, respectively, the third period being between the first and second horizontal periods.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Figure 4:
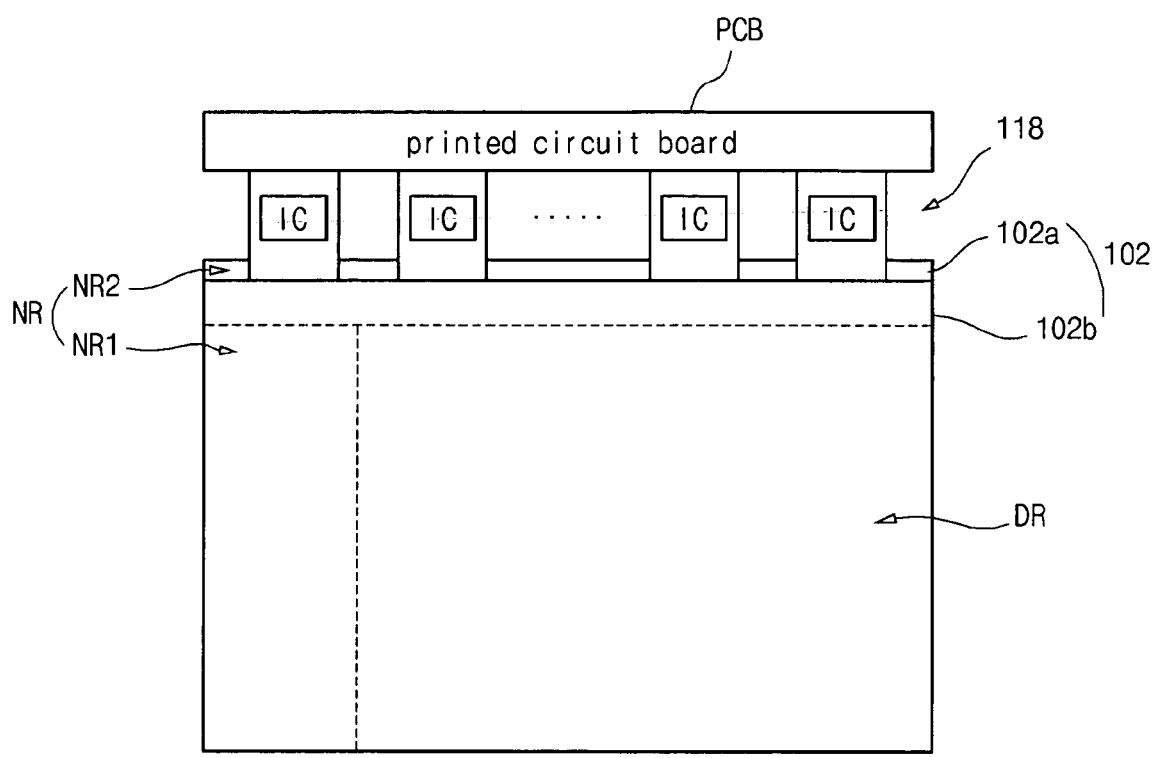
FIG. 4 is a view of an LCD device according to the present invention.
Figure 5A:
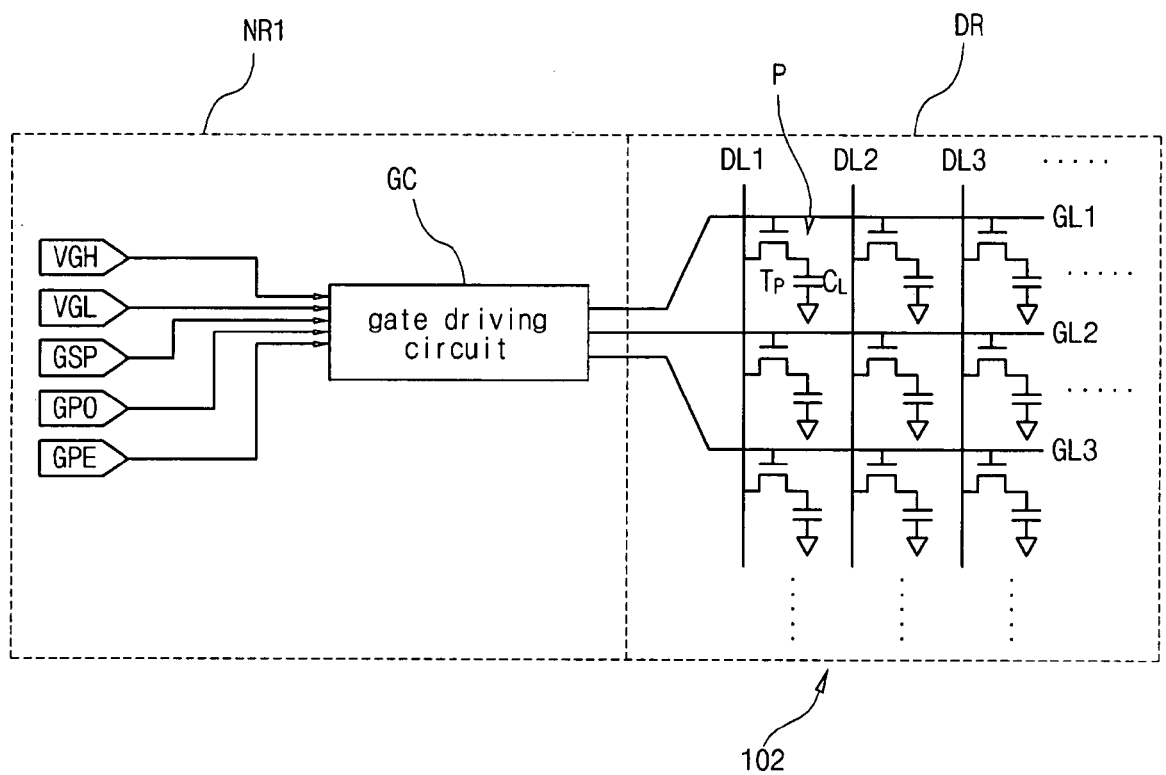
FIG. 5A is a view of a liquid crystal panel of FIG. 4.

Reference will now be made in detail to the illustrated embodiments of the present invention, which are illustrated in the accompanying drawings. FIG. 4 is a view of an LCD device according to the present invention. FIG. 5A is a view of a liquid crystal panel of FIG. 4, and FIG. 5B is a view of a connection structure of a data driver and a gate driving circuit according to the present invention.

Figure 5B:
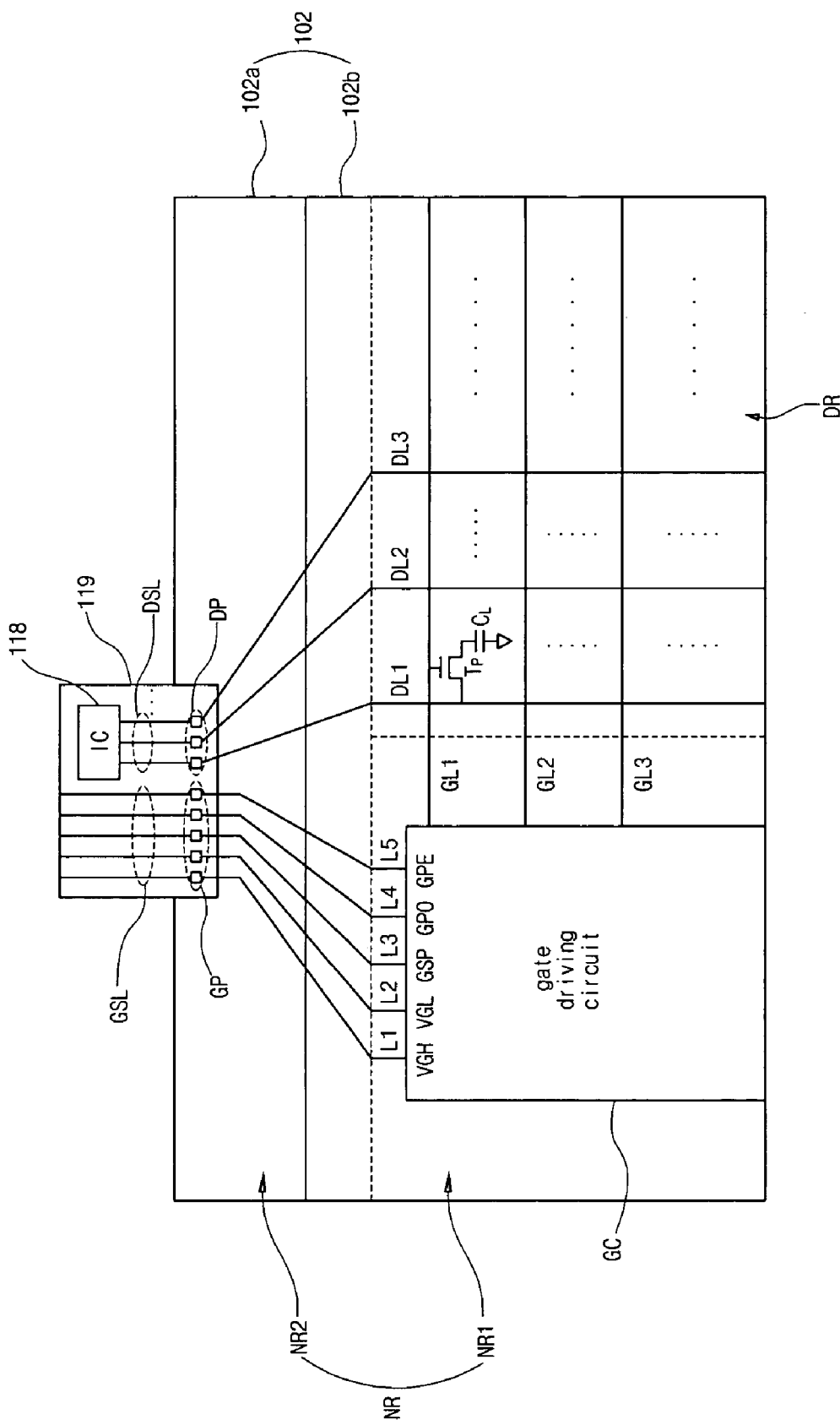
FIG. 5B is a view of a connection structure of a data driver and a gate driving circuit according to the present invention.

As shown in FIGS. 4 to 5B, an LCD device includes a printed circuit board PCB having an interface and a timing controller, a plurality of data drivers 118 using integrated chips (ICs), and a liquid crystal panel 102 having a display region DR and a non-display region NR at periphery portions of the display region DR. The liquid crystal panel 102 includes first and second substrates 102a and 102b facing each other, and a liquid crystal layer (not shown) interposed between the two substrates 102a and 102b.

In the display region DR, a plurality of a gate lines GL1 to GLn and a plurality of a data lines DL1 to DLm are disposed on the first substrate 102a. For convenience, only gate lines GL1 to GL3 and data lines DL1 and DL3 are shown. Each pixel P is connected to its corresponding gate and data lines GL and DL. Each pixel P includes a pixel transistor TP connected to the gate and data lines GL and DL, and a liquid crystal capacitor CL connected to the pixel transistor TP.

The non-display region NR includes a gate non-display region NR1 where a gate driving circuit GC is disposed, and a data non-display region NR2 where the data drivers 118 and the liquid crystal panel 102 are connected. The gate non-display region NR1 is defined at one end portion of the gate line GL, and the data non-display region NR2 is defined at one end portion of the data line DL.

In the gate non-display region NR1, the gate driving circuit GC is disposed on the same substrate, the first substrate 102a, as the gate and data lines GL and DL. In other words, the gate driving circuit GC is formed with the gate and data lines GL and DL, the pixel transistor TP and so on, on the first substrate 102a. The gate driving circuit GC may be covered by the second substrate 102b since the gate driving circuit GC is formed on the first substrate 102a.

The gate driving circuit GC is supplied with gate driving voltages including high and low gate voltages VGH and VGL, respectively, and gate control signals including a gate start pulse GSP, an odd gate pulse signal GPO and an even gate pulse signal GPE. Thus the gate driving circuit GC, for example, supplies first to third gate voltages Vg1 to Vg3 to the gate lines GL1 to GL3, respectively, during a vertical period (a frame). In a vertical period, each gate line GL is sequentially selected during a horizontal period, and the selected gate line is supplied with the high (on) gate voltage VGH and the non-selected gate line is supplied with the low (off) gate voltage VGL. The pixel transistors TP connected to the selected gate line are supplied with data voltages.

In the data non-display region NR2, data drivers 118 are connected to the liquid crystal panel 102. To do this, the data non-display region NR2 may be exposed by the second substrate 102b. As shown in FIG. 5B, data driver integrated chips (ICs) are connected to the first substrate 102a using connection film 119.

Figure 1:
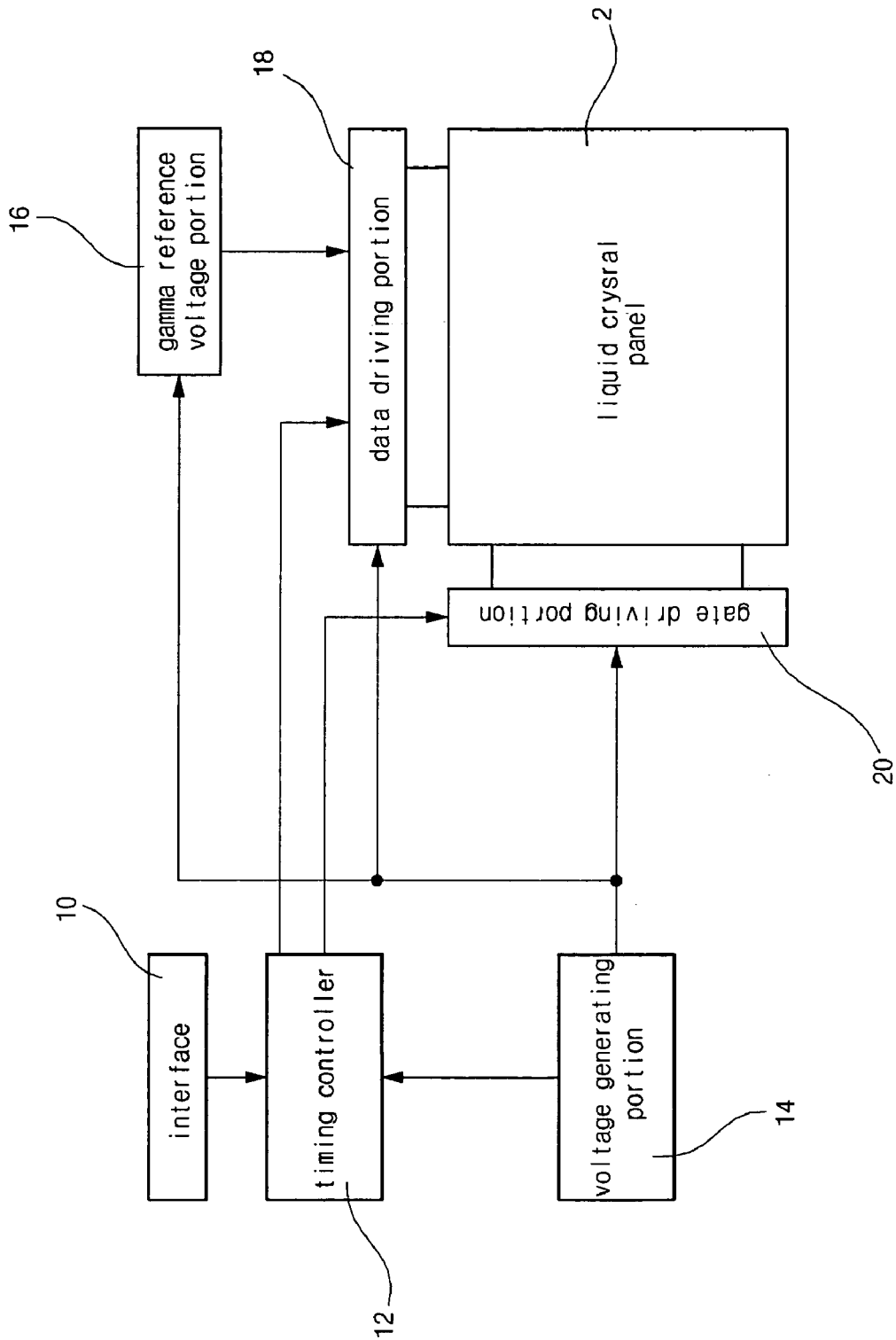
FIG. 1 is a block diagram of an LCD device according to the related art.
Figure 2:
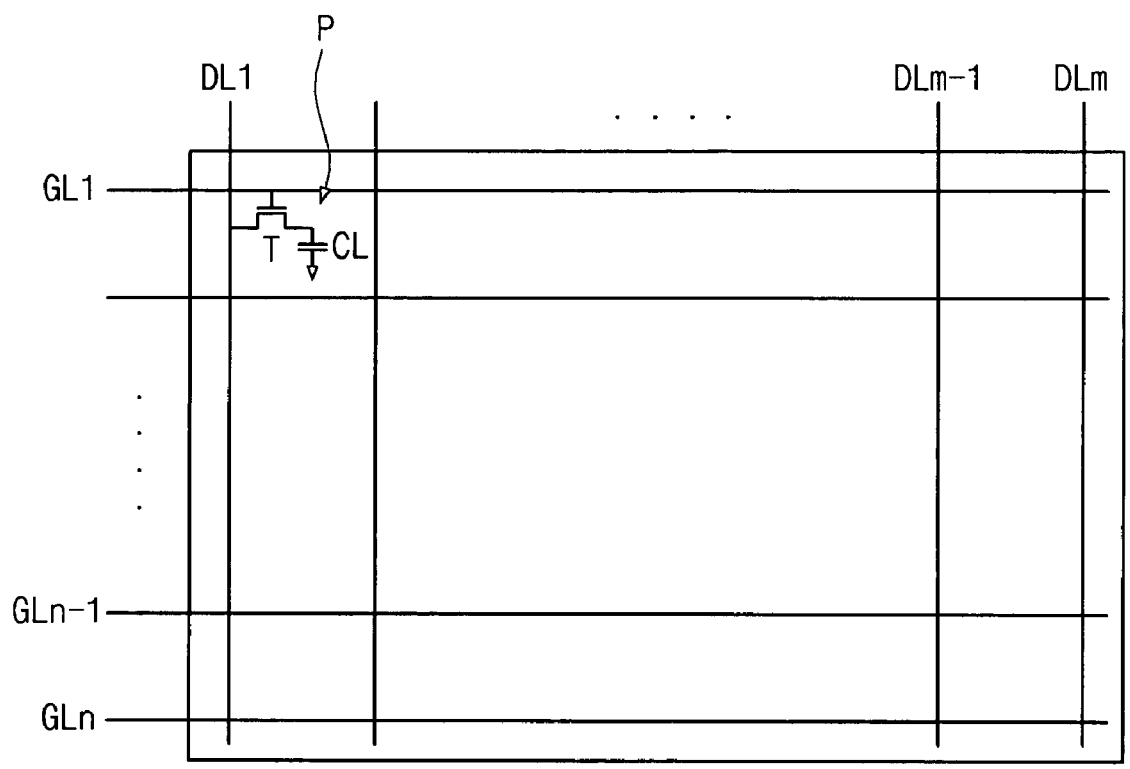
FIG. 2 is a schematic view of a liquid crystal panel of FIG. 1.
Figure 3:
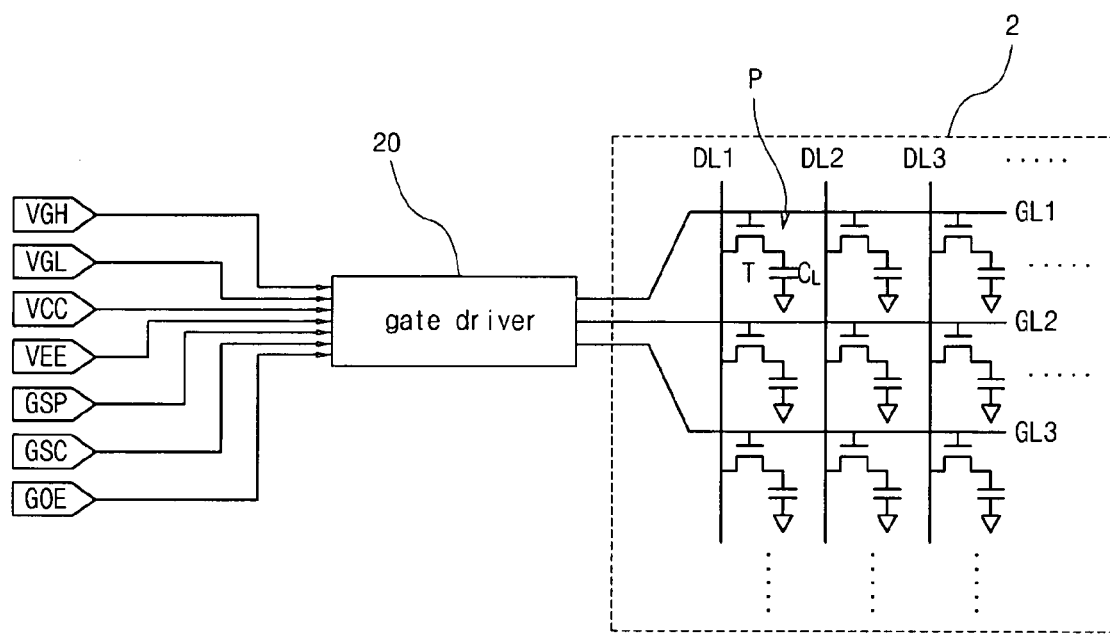
FIG. 3 is a view of a gate driver of an LCD device according to the related art.

In the connection film 119 adjacent to the gate driving circuit GC, first to fifth gate supplying lines GSL from the PCB for transferring the high and low gate voltages VGH and VGL, the gate start pulse GSP, and the odd and even gate signals GPO and GPE, and a plurality of data supplying lines DSL from the data driver ICs for transferring the data voltages are arranged. In particular, the high and low gate voltages VGH and VGL may be supplied from a voltage generating portion (14 of FIG. 1), and the gate start pulse GSP and the odd and even gate signals GPO and GPE may be supplied from a timing controller (12 of FIG. 1) or other controlling chip. The first to fifth gate supplying lines GSL are connected to first to fifth lines L1 to L5 through first to fifth gate supplying pads GP on the first substrate 102a, respectively. Accordingly, the first to fifth lines L1 to L5 are supplied with the high and low gate voltages VGH and VGL, the gate start pulse GSP, and the odd and even gate signals GPO and GPE, respectively. The data supplying lines DSL are connected to data lines DL1 to DL3 through the data pads DP. The high and low gate voltages VGH and VGL, the gate start pulse GSP, the odd and even gate signals GPO and GPE are supplied from the timing controller (not shown) on the printed circuit board PCB.

Figure 6:
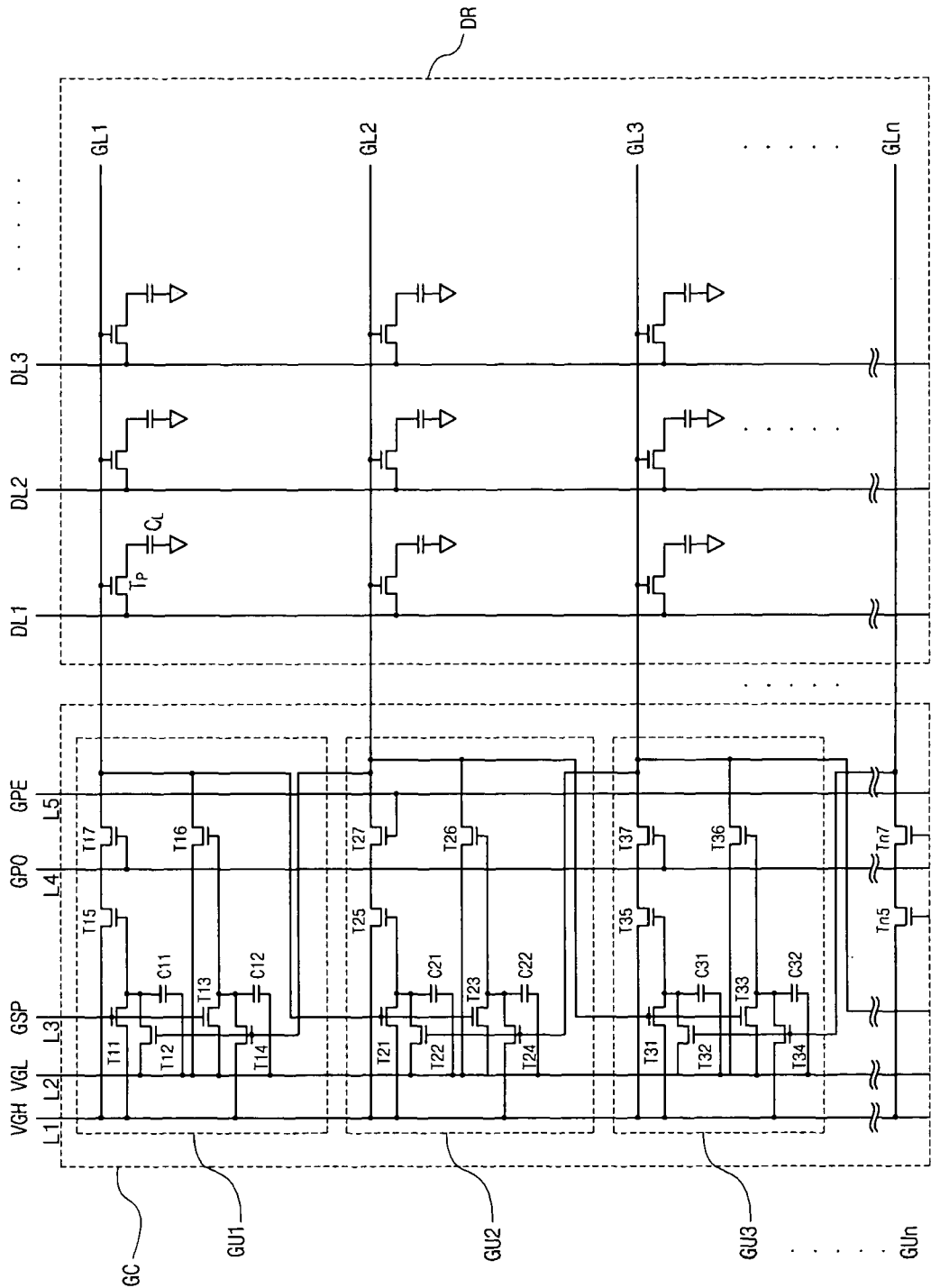
FIG. 6 is a circuit diagram of a gate driving circuit according to the present invention.
Figure 7A:
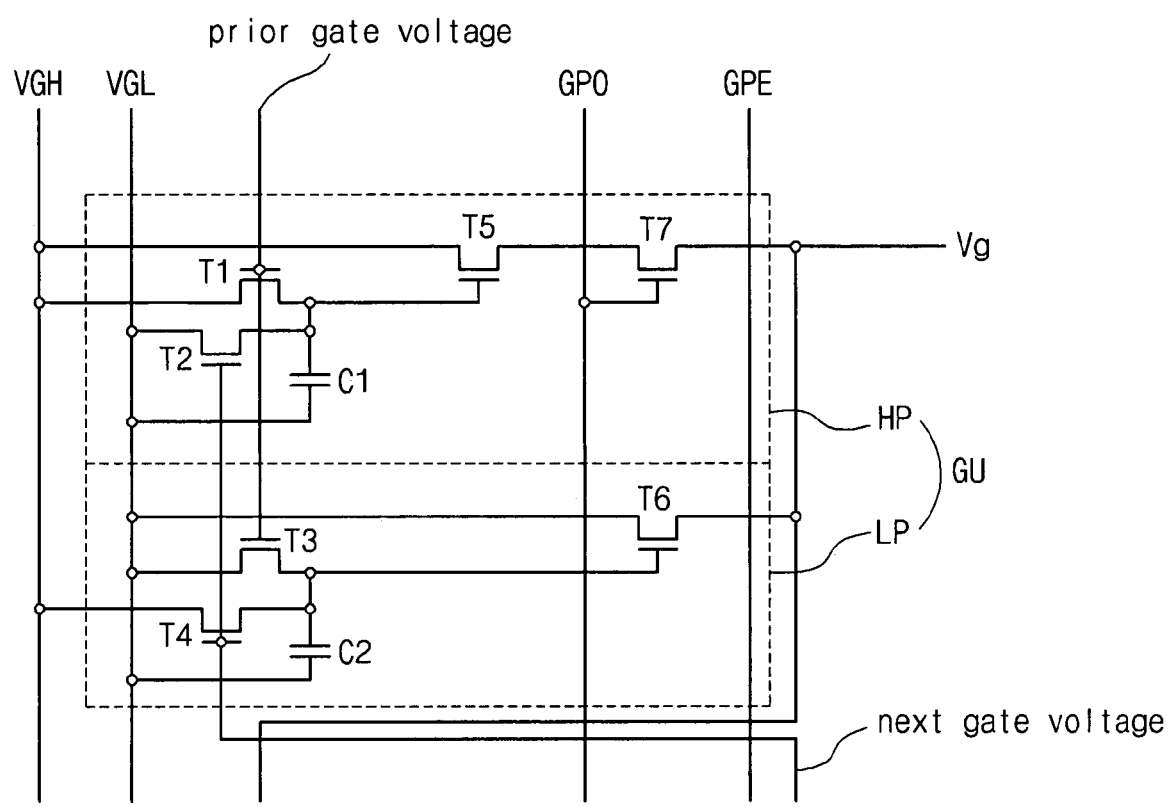
FIGS. 7A and 7B are circuit and block diagrams, respectively, of a gate driving unit of FIG. 6.
Figure 7B:
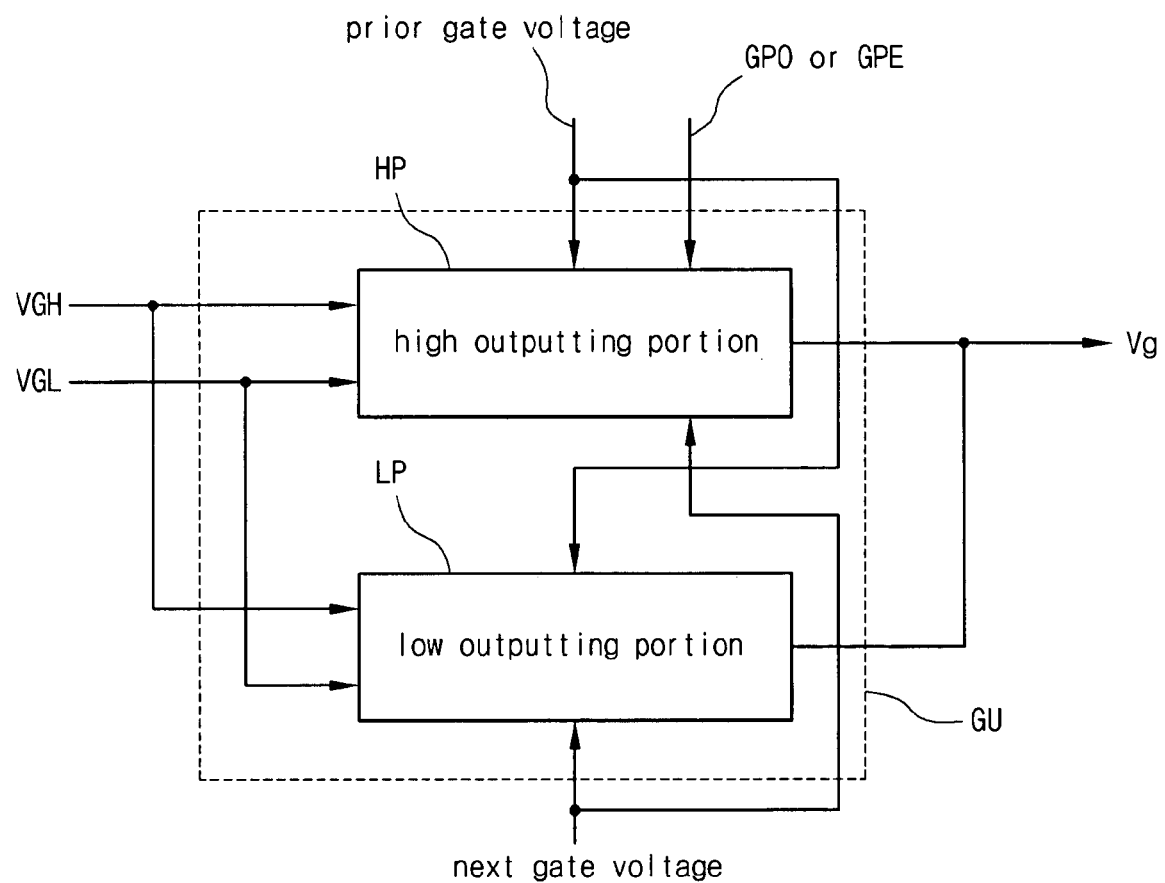
Figure 8A:
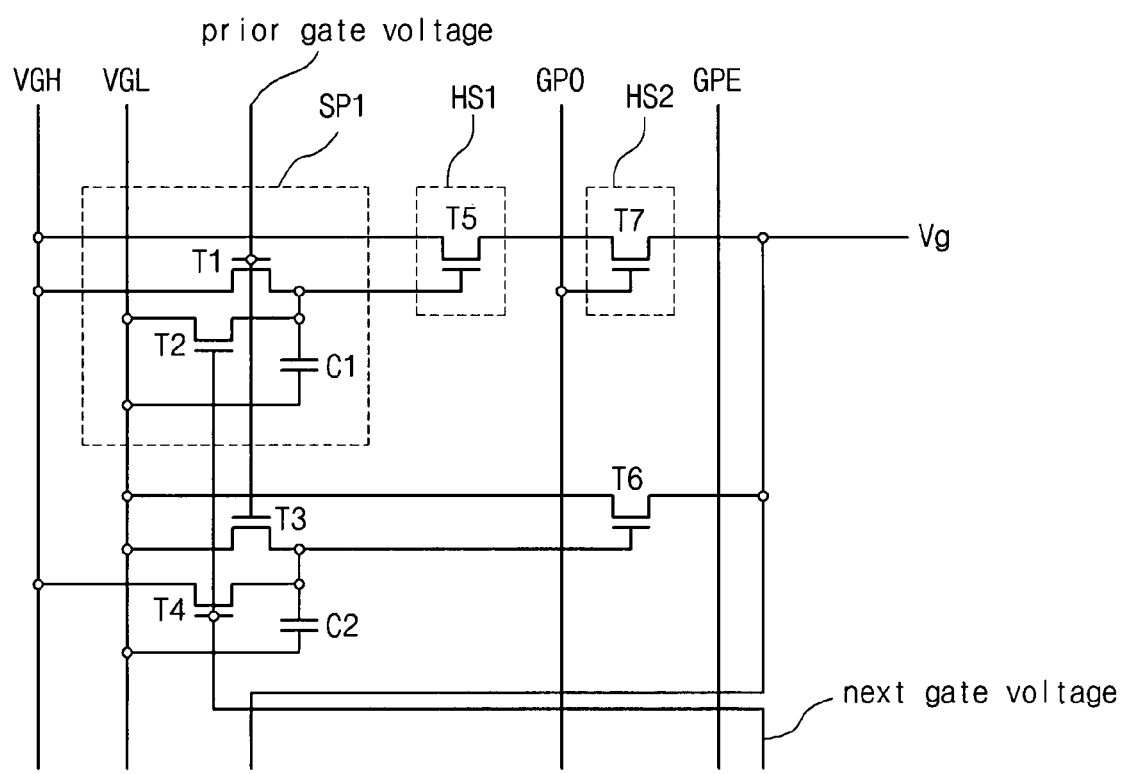
FIGS. 8A and 8B are circuit and block diagrams, respectively, of a high outputting portion of FIGS. 7A and 7B.
Figure 8B:
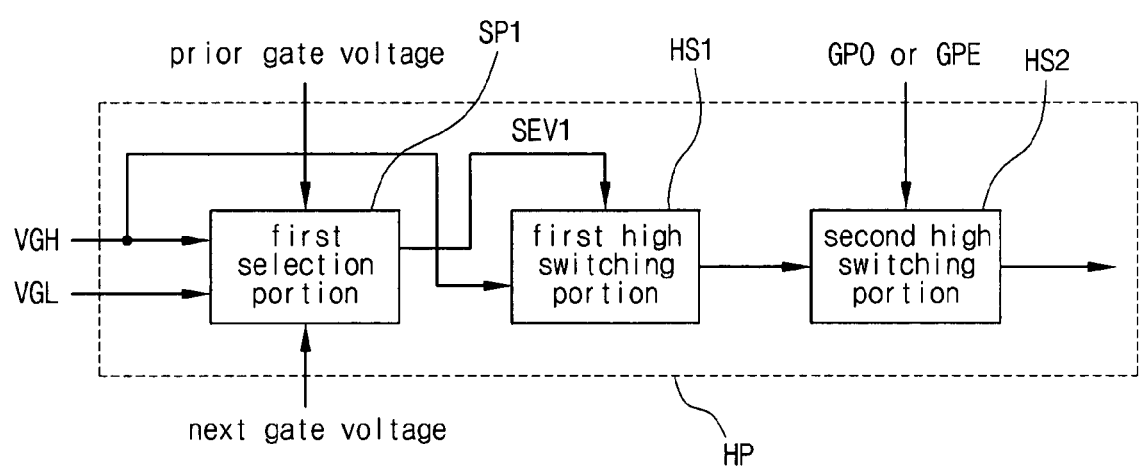
Figure 9A:
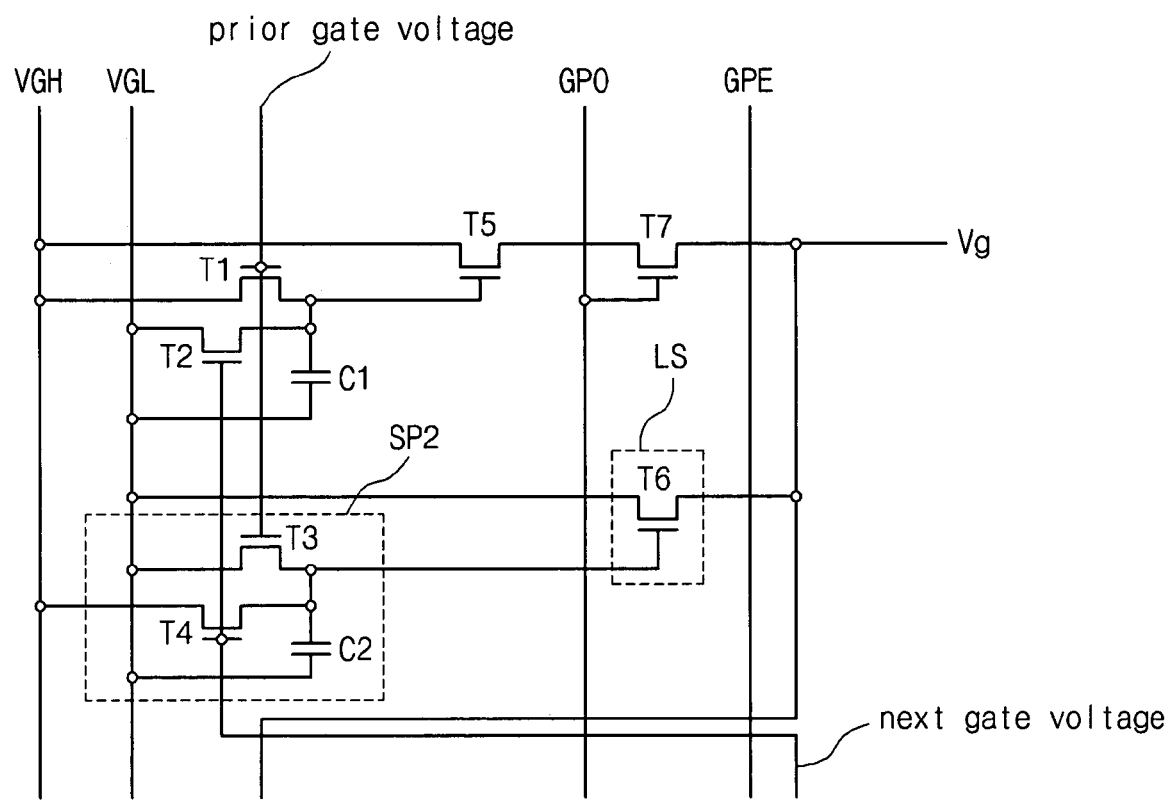
FIGS. 9A and 9B are circuit and block diagrams, respectively, of a low outputting portion of FIGS. 7A and 7B.
Figure 9B:
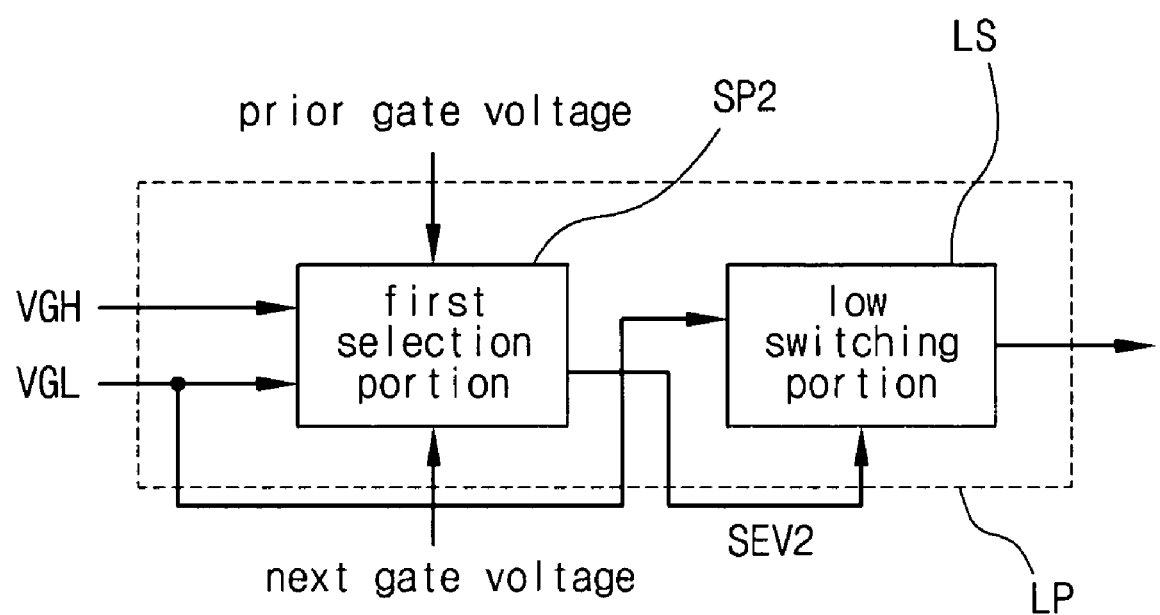

Hereinafter, the gate driving circuit will be explained in detail, with reference to the drawings. FIG. 6 is a circuit view of a gate driving circuit GC according to an embodiment of the present invention. FIGS. 7A and 7B are circuit and block diagrams, respectively, of a gate driving unit GU of FIG. 6. FIGS. 8A and 8B are circuit and block diagrams, respectively, of a high outputting portion of FIG. 7B. FIGS. 9A and 9B are circuit and block diagrams, respectively, of a low outputting portion of FIG. 7B.

As shown in FIGS. 6 to 9B, the gate driving circuit GC includes a plurality of gate driving units GU1 to GUn directly connected to a plurality of gate lines GL1 to GLn, respectively. The gate driving units GU1 to GUn supply gate voltages Vg1 to Vgn to the respective gate lines GL1 to GLn, respectively, in a vertical period. Each driving unit GU sequentially outputs a high gate voltage VGH to each gate line GL during a horizontal period.

To output the gate voltage Vg, the gate driving unit GU uses high and low gate voltages VGH and VGL, the odd and even gate pulse signals GPO and GPE, a gate voltage of the prior gate driving unit and a gate voltage of the next gate driving unit. For example, the second gate driving unit GU2 is supplied with the first gate voltage Vg1 as the prior gate voltage, and the third gate voltage Vg3 as the next gate voltage. However, the first gate driving unit GU1 uses the gate start pulse GSP because a prior gate voltage does not exist.

The odd and even gate pulse signals GPO and GPE are alternately supplied to the gate driving units GU1 to GUn. In other words, the odd gate pulse signal GPO is supplied to the odd gate driving units GU1, GU3, GU5, and so on, and the even gate pulse signal GPE is supplied to the even gate driving units GU2, GU4, GU6, and so on.

The gate driving unit GU includes a high outputting portion HP and a low outputting portion LP. The high outputting portion HP uses high and low gate voltages VGH and VGL, the odd or even gate pulse signals GPO or GPE, and the prior and next gate voltages, to output the high gate voltage VGH during a horizontal period. The low outputting portion LP uses the high and low gate voltages VGH and VGL, and the prior and next gate voltages to output the low gate voltage VGL during a non-selected time out of a vertical period.

The high outputting portion HP includes a first selection portion SP1, and first and second high switching portions HS1 and HS2, respectively. The low outputting portion LP includes a second selection portion SP2 and a low switching portion LS.

The first selection portion SP1 selects high or low voltages VGH or VGL depending upon the prior and next gate voltages, and outputs a first selected voltage SEV1. The first high switching portion HS1 switches the high voltage VGH depending upon the first selected voltage SEV1. The second high switching portion HS2 switches the high voltage VGH switched by the first high switching portion HS1 depending upon the odd or even gate pulse signals GPO or GPE. FIG. 8A shows transistor T7 of the second high switching portion HS2 connected to the odd gate pulse signal GPO because the gate driving unit GU shown is the first gate driving unit GU1. For the second gate driving unit GU2, the transistor T7 is connected to the even gate pulse signal GPE (see FIG. 6).

The second selection portion SP2 selects high or low voltages VGH or VGL depending upon the prior and next gate voltages, and outputs a second selected voltage SEV2. The low switching portion LS switches the low voltage VGL depending upon the second selected voltage SEV2.

The first and second selection portion SP1 and SP2 output opposite level voltages. For example, while the first selected voltage SEV1 is a high gate voltage VGH, the second selected voltage SEV2 is a low gate voltage VGL. To do this, the first selection portion SP1 has a transistor-connection opposite to the second selection portion SP2. The first selection portion SP1 includes first and second transistors T1 and T2 connected through drain terminals of both transistors, and the second selection portion SP2 includes third and fourth transistors T3 and T4 connected through drain terminals of both transistors. The drain terminals of the first and second transistors T1 and T2 act as an output terminal of the first selection portion SP1, and the drain terminals of the third and fourth transistors T3 and T4 act as an output terminal of the second selection portion SP2. Both the first and third transistors T1 and T3 are supplied with the prior gate voltage. However, while the first transistor T1 is supplied with the high gate voltage VGH, the third transistor T3 is supplied with the low gate voltage VGL. Furthermore, both the second and fourth transistors T2 and T4 are supplied with the next gate voltage. However, while the second transistor T2 is supplied with the low gate voltage VGL, the fourth transistor T4 is supplied with the high gate voltage VGH. As such, since transistor-connections of the first and second selection portions SP1 and SP2 are opposite of each other, the first and second selection portions SP1 and SP2 output opposite level voltages.

The first and second selection portions SP1 and SP2 further include first and second capacitors C1 and C2 storing the first and second selected voltages SEV1 and SEV2, respectively. The first capacitor C1 is connected to the output terminal of the first selection portion SP1 and the second supplying line L1, and the second capacitor C2 is connected to the output terminal of the second selection portion SP2 and the second supplying line L2.

The first high switching portion HS1 and the low switching portion LS have fifth and sixth transistors T5 and T6. The first high switching portion HS1 is turned on or off depending on whether the first selected voltage SEV1 is high or low gate voltages VGH or VGL, and thus switches the high gate voltage VGH. The low switching portion LS is turned on or off depending on whether the second selected voltage SEV2 is high or low gate voltages VGH or VGL, and thus switches the low gate voltage VGL.

The second high switching portion HS2 has a seventh transistor T7. The second high switching portion HS2 is turned on or off depending on whether the odd or even gate pulses GPO or GPE is high or low, and thus switches the high gate voltage VGH outputted from the first high switching portion HS1.

As explained above, the gate driving circuits have a plurality of transistors. The transistors of the gate driving circuits may be formed in the same processes of forming the pixel transistors. In a preferred embodiment, all the transistors of the present invention may be formed on an amorphous silicon layer. Furthermore, the first through fifth lines for transferring the gate driving voltages and gate control signals may be formed in the same processes of forming the gate and data lines.

Figure 10:
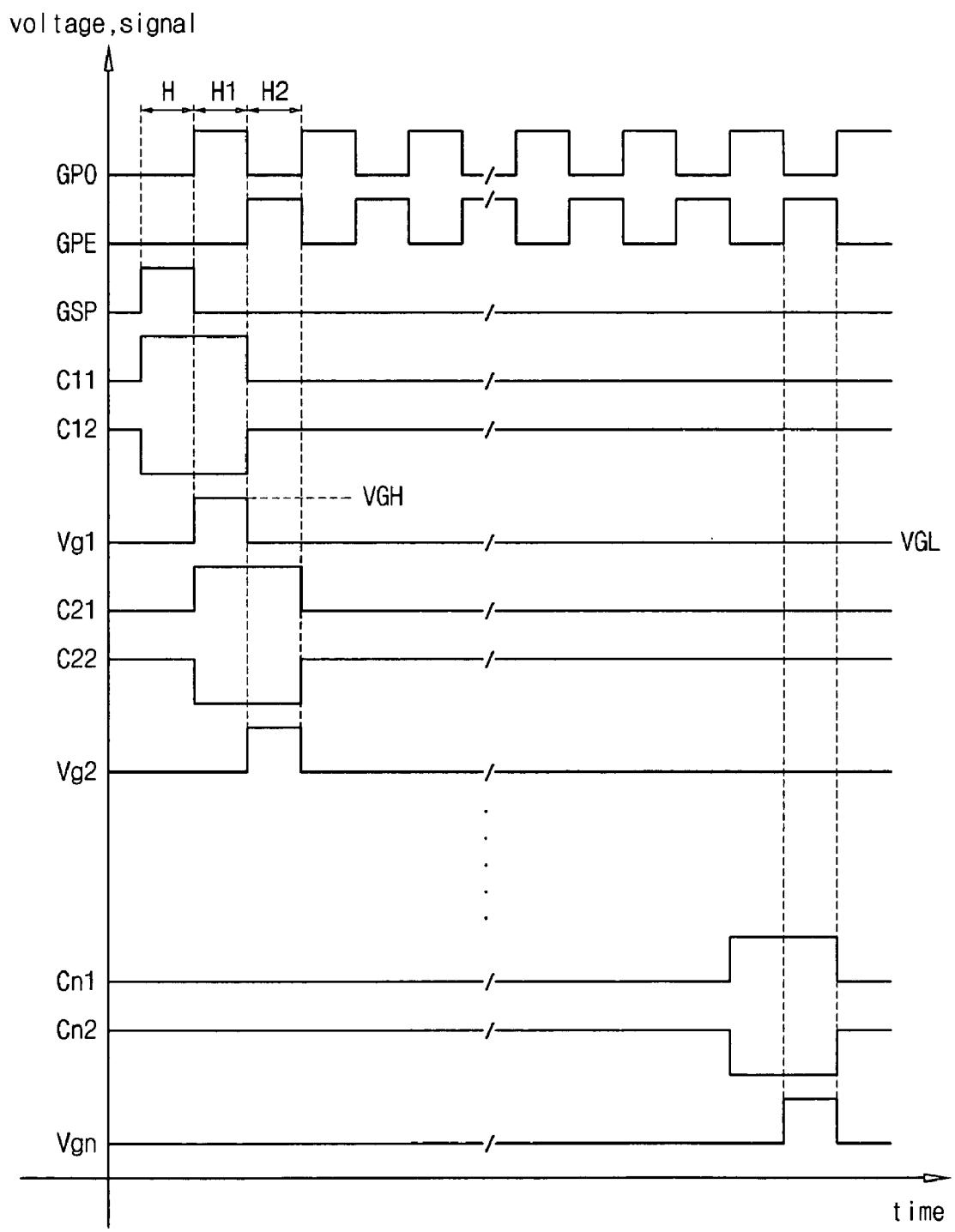
FIG. 10 is a timing diagram of driving voltages and control signals for a gate driving circuit of an LCD device according to the present invention.

FIG. 10 is a timing diagram of driving voltages and control signals for a gate driving circuit of an LCD device according to an embodiment of the present invention. With reference to FIGS. 6 to 10, driving method for a gate driving circuit will be explained in detail. As a matter of convenience, references will be made to the components related to the first three gate and data units as shown in FIGS. 6 to 10. However, it will be understood that the details set forth below apply to all of the like components of this embodiment of the present invention in the same manner.

In an offset state, the gate driving units GU1 to GUn are turned off. In other words, the first and second capacitors C1 and C2 of each gate driving unit GU are supplied with the low gate voltages VGL, and thus the first to seventh transistors T1 to T7 of each gate driving unit GU are turned off. Accordingly, the gate driving units GU1 to GUn do not output the gate voltages Vg1 to Vgn.

Next, to supply the first gate voltage Vg1 to the first gate line GL1, a high level of the gate start pulse GSP is supplied to the first gate driving unit GU1. The gate start pulse GSP is supplied at a horizontal period H prior to outputting the data voltages, i.e., prior to starting a frame F. The gate start pulse GSP is supplied to both the first and third transistors T11 and T13 of the first gate driving unit GU1 during a horizontal period H. Thus the high and low gate voltages VGH and VGL are stored in the first and second capacitors C11 and C12 of the first gate driving unit GU1, respectively, in effect turning on and off the first and second capacitors C11 and C12, respectively. The second and fourth transistors T12 and T14 of the first gate driving unit GU1 are turned off since the second gate voltage Vg2 is not outputted. Accordingly, the first and second selection portions SP1 and SP2 of the first gate driving unit GU1 output the first selected voltage SEV1 of the high gate voltage VGH and the second selected voltage SEV2 of the low gate voltage VGL, respectively.

Next, the fifth and sixth transistors T15 and T16 of the first gate driving unit GU1 are turned on and off, respectively, since the first and second selected voltage SEV1 and SEV2 are the high and low gate voltages VGH and VGL, respectively. Accordingly, the first high switching portion HS1 of the first gate driving unit GU1 outputs the high gate voltage VGH, while the low switching portion LS of the first gate driving unit GU1 does not output the low gate voltage VGL.

Next, depending upon the odd gate pulse GPO, the seventh transistor T17 of the first gate driving unit GU1 switches the high gate voltage VGH outputted from the fifth transistor T15 of the first gate driving unit GU1. The odd gate pulse GPO is supplied to the seventh transistor T17 of the first gate driving unit GU1 at a starting time of the frame F. The odd gate pulse GPO is supplied during a first horizontal period H1, and thus the seventh transistor T17 of the first gate driving unit GU1 is turned on during the first horizontal period H1. Accordingly, the second high switching portion HS2 of the first gate driving unit GU1 outputs the first gate voltage Vg1 of the high gate voltage VGH to the first gate line GL1 during the first horizontal period H1.

When the first gate voltage Vg1 of the high gate voltage VGH is supplied to the pixel transistors TP connected to the first gate line GL1, the data voltages are supplied to the pixels P connected to the first gate line GL1 through the data lines DL1 to DL3, and the data voltages are stored in the respective liquid crystal capacitors CL.

After the first horizontal period H1 is finished, the second gate driving unit GU2 outputs the second gate voltage Vg2 of the high gate voltage VGH during a second horizontal period H2, similarly to outputting the first gate voltage Vg1 of the first gate driving unit GU1. The second gate driving unit GU2 uses the first gate voltage Vg1 instead of the gate start pulse GSP, and the even gate pulse GPE instead of the odd gate pulse GPO.

When the second gate voltage Vg2 is outputted from the second gate driving unit GU2, the second gate voltage Vg2 is supplied to the first gate driving unit GU1. The second gate voltage Vg2 is supplied to the second and fourth transistors T12 and T14 of the first gate driving unit GU1. When the second gate voltage Vg2 is the high gate voltage VGH, the second and fourth transistors T12 and T14 of the first gate driving unit GU1 are turned on, and the low and high gate voltages VGH and VGL are supplied to the first and second capacitors C11 and C12 of the first gate driving unit GU1, respectively. Accordingly, the fifth and sixth transistors T15 and T16 of the first gate driving unit GU1 are turned off and on, respectively, and thus the first gate driving unit GU1 outputs the first gate voltage Vg1 of the low gate voltage VGL.

The above explained driving method of the first and second gate driving units GU1 and GU2 can be similarly applied to the other gate driving units GU3 to GUn using the odd and even gate pulses GPO and GPE. In particular, each odd and even gate pulses GPO and GPE have high and low levels alternating per horizontal period H, with the levels between the odd and even gate pulses GPO and GPE being opposite. Accordingly, the gate driving units GU1 to GUn sequentially output the high gate voltages VGH during the frame F, and thus the gate voltages Vg1 to Vgn of the high gate voltages VGH are sequentially supplied to the gate lines GL1 to GLn.

Figure 11:
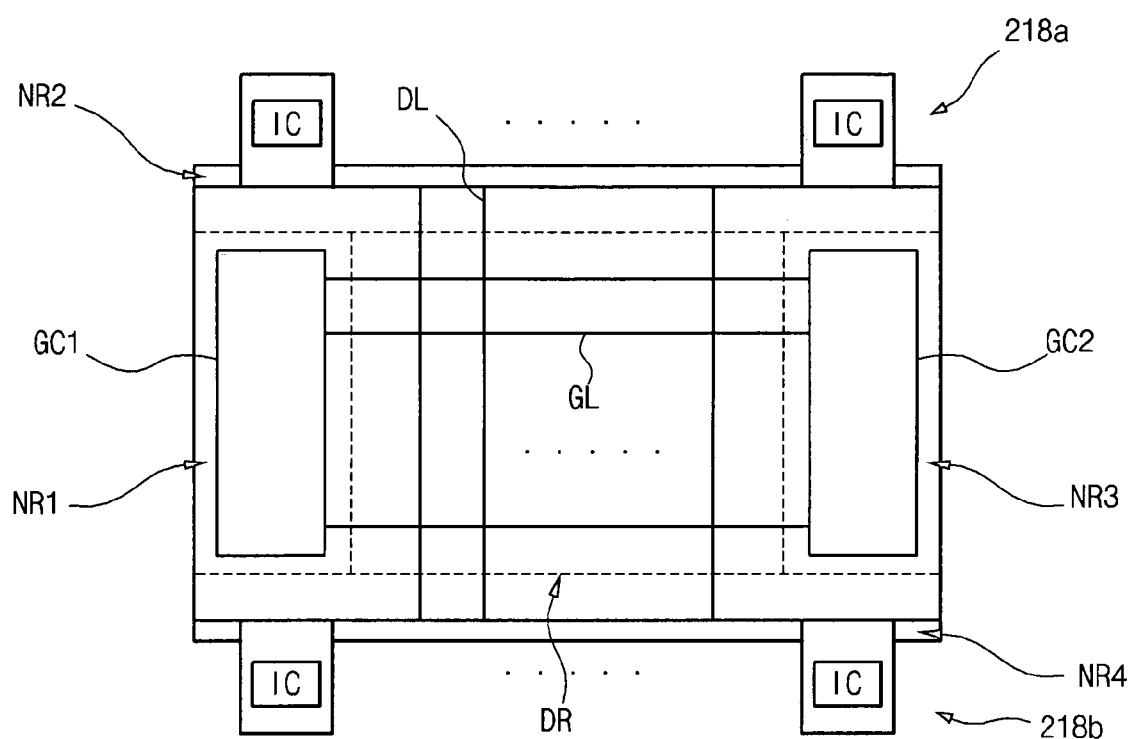
FIG. 11 is a view of an LCD device including a plurality of gate driving circuits and data drivers according to another embodiment of the present invention.

FIG. 11 is a view of an LCD device including a plurality of gate driving circuits and data drivers according to another embodiment of the present invention. In the LCD device of FIG. 4, a gate driving circuit is disposed in a first non-display region and data drivers are connected to a second non-display region. The LCD device, as shown in FIG. 11, includes a plurality of gate driving circuits and data drivers. This configuration is advantageous for LCD devices with large sizes and/or high resolutions where a plurality of gate driving circuits GC and data drivers 218 may be required.

The gate driving circuits GC may include first and second gate driving circuits GC1 and GC2, and the data drivers 218 include first and second set of data drivers 218a and 218b. The first and second gate driving circuits GC1 and GC2 may be disposed in first and third non-display regions NR1 and NR3 at both end portions of a gate line GL. The first and second data drivers may be connected to second and fourth non-display regions NR2 and NR4 at both end portions of a data line DL.

Although the LCD device of FIG. 11 includes the gate driving circuits disposed in the first and third non-display regions NR1 and NR3, and the data drivers connected to the second and fourth non-display regions NR2 and NR4, the arrangement thereof is not limited to this configuration. For example, the gate driving circuits may be arranged in the first and third non-display regions NR1 and NR3, and the data drivers may be connected to the second non-display region NR2. Also, the gate driving circuits may be arranged in the first non-display region NR1, and the data drivers may be disposed in the second and fourth non-display regions NR2 and NR4.

In the present invention, the gate driving circuit is formed in the liquid crystal panel when the liquid crystal panel is fabricated. Accordingly, separate gate driver integrated chips (ICs) and separate processes for bonding the driver integrated chips (ICs) to the liquid crystal panel are not required. Therefore, production processes can be simplified and production costs for the LCD device can be reduced. Furthermore, since the gate driver integrated chips (ICs) are not required, the gate pads are also not required. Therefore, areas for the gate pads can be reduced, and thus periphery portions of the liquid crystal panel can be reduced. Furthermore, the number of the driving voltages, gate control signals, and path lines are reduced. Therefore, power consumption can be reduced and driving circuit reliability can increase.

It will be apparent to those skilled in the art that various modifications and variations can be made in the LCD device and method of driving an LCD device of the present invention without departing from the spirit or scope of the invention. For instance, the present invention may also be applied to other display devices. Thus, it is intended that the present invention cover the modifications and variations of this invention provided they come within the scope of the appended claims and their equivalents.

What is claimed is:

1. A display device, comprising:
    first and second substrates facing each other, the first substrate having a display region and a non-display region;
    at least one data line on the first substrate;
    at least one gate line crossing the data line, the gate line supplied with a gate voltage;
    at least one pixel in the display region connected to a corresponding gate line and data line; and
    a first driving circuit including at least:
        a first driving unit connected to a first gate line to output a first gate voltage; and
        a second driving unit connected to a second gate line to output a second gate voltage, wherein the first driving unit is supplied with at least a start gate voltage and the second gate voltage from the second driving unit to output the first gate voltage to the pixel,
    wherein each of the first and second driving units is supplied with an on gate voltage, an off gate voltage, and a control signal
    wherein the first driving unit includes: a first portion outputting the on gate voltage, the first portion being supplied with the on and off gate voltages, the start gate voltage, the second gate voltage, and a first control signal; and a second portion outputting the off gate voltage, the second portion being supplied with the on and off gate voltages, the start gate voltage, and the second gate voltage,
    wherein the first portion includes: a first selection portion selecting one of the on and off gate voltages using the start and second gate voltages, and a first switching portion switching the on gate voltage using the outputted voltage from the selection portion and the first control signal, and
    wherein the first switching portion includes: a first switching section switching the on gate voltage using the outputted voltage from the first selection portion, and a second switching section switching the outputted voltage from the first switching portion using the first control signal.

2. The device according to claim 1, wherein the first driving circuit is located in the non-display region on the first substrate connected to the gate line to output the gate voltage to the pixel.

3. The device according to claim 1, wherein the first switching section includes a first transistor and the second switching section includes a second transistor.

4. The device according to claim 1, further comprising first, second and third lines transferring the on gate voltage, the off gate voltage and the control signal, respectively, the first, second and third lines being in the non-display region on the first substrate.

5. The device according to claim 1, wherein the driving circuit is formed on amorphous silicon.

6. The device according to claim 1, further comprising a second driving circuit, wherein the display region is between the first and second driving circuits.

7. The device according to claim 1, further comprising a liquid crystal layer between the first and second substrates.

8. The device according to claim 7, wherein the pixel includes a transistor connected to the gate line and the data line, and a liquid crystal capacitor.

9. The device according to claim 1, wherein the start gate voltage is a gate start pulse from a timing controller.

10. A display device, comprising:
    first and second substrates facing each other, the first substrate having a display region and a non-display region;
    at least one data line on the first substrate;
    at least one gate line crossing the data line, the gate line supplied with a gate voltage;
    at least one pixel in the display region connected to a corresponding gate line and data line; and
    a first driving circuit including at least:
        a first driving unit connected to a first gate line to output a first gate voltage; and
        a second driving unit connected to a second gate line to output a second gate voltage, wherein the first driving unit is supplied with at least a start gate voltage and the second gate voltage from the second driving unit to output the first gate voltage to the pixel,
    wherein each of the first and second driving units is supplied with an on gate voltage, an off gate voltage, and a control signal,
    wherein the first driving unit includes: a first portion outputting the on gate voltage, the first portion being supplied with the on and off gate voltages, the start gate voltage, the second gate voltage, and a first control signal; and a second portion outputting the off gate voltage, the second portion being supplied with the on and off gate voltages, the start gate voltage, and the second gate voltage,
    wherein the first portion includes: a first selection portion selecting one of the on and off gate voltages using the start and second gate voltages, and a first switching portion switching the on gate voltage using the outputted voltage from the selection portion and the first control signal, and
    wherein the first selection portion includes a first transistor switching the on gate voltage using the start gate voltage, and a second transistor switching the off gate voltage using the second gate voltage.

11. The device according to claim 10, further comprising a capacitor storing the outputted voltage from the first selection portion.

12. A display device, comprising:
    first and second substrates facing each other, the first substrate having a display region and a non-display region;
    at least one data line on the first substrate;
    at least one gate line crossing the data line, the gate line supplied with a gate voltage;
    at least one pixel in the display region connected to a corresponding gate line and data line; and
    a first driving circuit including at least:

a first driving unit connected to a first gate line to output a first gate voltage; and a second driving unit connected to a second gate line to output a second gate voltage, wherein the first driving unit is supplied with at least a start gate voltage and the second gate voltage from the second driving unit to output the first gate voltage to the pixel, wherein each of the first and second driving units is supplied with an on gate voltage, an off gate voltage, and a control signal, wherein the first driving unit includes: a first portion outputting the on gate voltage, the first portion being supplied with the on and off gate voltages, the start gate voltage, the second gate voltage, and a first control signal; and a second portion outputting the off gate voltage, the second portion being supplied with the on and off gate voltages, the start gate voltage, and the second gate voltage, wherein the first portion includes: a first selection portion selecting one of the on and off gate voltages using the start and second gate voltages, and a first switching portion switching the on gate voltage using the outputted voltage from the selection portion and the first control signal, wherein the second portion includes: a second selection portion selecting one of the on and off gate voltages using the start and second gate voltages, and a second switching portion switching the off gate voltage using the outputted voltage from the second selection portion, and wherein the second selection portion includes a first transistor switching the off gate voltage using the start gate voltage, and a second transistor switching the on gate voltage using the second gate voltage.

13. The device according to claim 12, further comprising a capacitor storing the outputted voltage from the second selection portion.

14. The device according to claim 12, wherein the second switching portion includes a transistor.

15. A method of driving a display device, comprising:

outputting first and second gate voltages from first and second driving units to first and second gate lines, respectively;

outputting first and second intermediate voltages using the first and second gate voltages, the first intermediate voltage being one of on and off gate voltages, and the second intermediate voltage being the opposite of the first intermediate voltage;

outputting a third gate voltage from a third driving unit to a third gate line using the first and second intermediate voltages and a first control signal, the third gate voltage being one of on and off gate voltages; and outputting a data voltage to a data line and storing the data voltage in a pixel connected to the third gate line and the data line, wherein the first, second and third gate voltages have the on gate voltages in first, second and third horizontal periods, respectively, the third horizontal period being between the first and second horizontal periods, wherein the third driving unit includes: a first portion outputting the on gate voltage, the first portion being supplied with the on and off gate voltages, the first and second gate voltages, and the first control signal; and a second portion outputting the off gate voltage, the second portion being supplied with the on and off gate voltages and the first and second gate voltages, wherein the first portion includes: a first selection portion selecting one of the on and off gate voltages as the first intermediate voltage using the first and second gate voltages, and a first switching portion switching the on gate voltage using the first intermediate voltage and the first control signal, and wherein the first switching portion includes: a first switching section switching the on gate voltage using the first intermediate voltage, and a second switching section switching the outputted voltage from the first switching section using the first control signal.

16. The method according to claim 15, wherein the second portion includes: a second selection portion selecting the other of the on and off gate voltages as the second intermediate voltage using the first and second gate voltages, and a second switching portion switching the off gate voltage using the second intermediate voltage, and wherein the second selection portion includes a first transistor switching the off gate voltage using the first gate voltage, and a second transistor switching the on gate voltage using the second gate voltage.

17. The method according to claim 15, wherein the first selection portion includes a first transistor switching the on gate voltage using the first gate voltage, and a second transistor switching the off gate voltage using the second gate voltage.

18. The method according to claim 15, wherein the first switching section includes a first transistor switching the on gate voltage using the first intermediate voltage, and switching the outputted voltage from the first switching section using the first control signal.

19. The method according to claim 15, wherein outputting the first gate voltage includes:

outputting third and fourth voltages using the third gate voltage and a gate start pulse, the third voltage being one of the on and off gate voltages, and the fourth voltage being the other of the on and off gate voltages; and outputting the first gate voltage using the third and fourth voltages, and a second control signal, the first gate voltage being one of the on and off gate voltages.

20. The method according to claim 19, wherein the first and second control signals have on and off levels alternately per horizontal period, the first control signal having the on level in the third horizontal period, and the second control signal having the off level in the first horizontal period.

21. The method according to claim 19, wherein the gate start pulse has an on level at a time prior to a starting time of the first horizontal period.

22. The method according to claim 21, wherein the gate start pulse has the on level during a horizontal period prior to the starting time of the first horizontal period.

23. The method according to claim 15, further comprising storing the first and second intermediate voltages.

24. The method according to claim 15, wherein the stored data voltage in the pixel drives a liquid crystal layer.

* * * * *